United States Patent
Williams et al.

[11] Patent Number: 6,066,877
[45] Date of Patent: *May 23, 2000

[54] VERTICAL POWER MOSFET HAVING THICK METAL LAYER TO REDUCE DISTRIBUTED RESISTANCE

[75] Inventors: Richard K. Williams, Cupertino; Mohammad Kasem, Santa Clara, both of Calif.

[73] Assignee: Siliconix Incorporated, Santa Clara, Calif.

[*] Notice: This patent is subject to a terminal disclaimer.

[21] Appl. No.: 08/779,176

[22] Filed: Jan. 6, 1997

Related U.S. Application Data

[63] Continuation of application No. 08/367,486, Dec. 30, 1994, Pat. No. 5,665,996.

[51] Int. Cl.⁷ .................................................. H01L 29/76
[52] U.S. Cl. ............................ 257/341; 257/337; 257/401
[58] Field of Search ...................... 257/341, 335, 257/337, 342, 401, 139, 147, 766, 786

[56] References Cited

U.S. PATENT DOCUMENTS

| | | | |
|---|---|---|---|
| 4,268,849 | 5/1981 | Gray et al. ................................. | 357/71 |
| 4,767,722 | 8/1988 | Blanchard .................................. | 437/41 |
| 4,864,370 | 9/1989 | Gaw et al. .................................. | 357/17 |
| 4,984,061 | 1/1991 | Matsumoto ................................. | 357/68 |
| 5,008,734 | 4/1991 | Dutta et al. ................................ | 257/693 |
| 5,023,692 | 6/1991 | Wodarczyk et al. ....................... | 357/43 |
| 5,045,903 | 9/1991 | Meyer et al. . | |
| 5,119,153 | 6/1992 | Korman et al. ........................... | 257/341 |
| 5,270,253 | 12/1993 | Arai et al. ................................. | 437/189 |
| 5,272,098 | 12/1993 | Smayling et al. ......................... | 437/41 |
| 5,272,111 | 12/1993 | Kosaki ...................................... | 437/192 |
| 5,310,699 | 5/1994 | Chikawa et al. .......................... | 437/183 |
| 5,315,156 | 5/1994 | Lott .......................................... | 257/728 |
| 5,321,302 | 6/1994 | Shimawaki ............................... | 257/592 |
| 5,349,239 | 9/1994 | Hiroya ...................................... | 357/737 |
| 5,359,220 | 10/1994 | Larson et al. ............................. | 257/378 |
| 5,405,794 | 4/1995 | Kim ........................................... | 437/41 |
| 5,468,688 | 11/1995 | Kohl et al. ................................ | 437/237 |
| 5,468,984 | 11/1995 | Efland et al. ............................. | 257/356 |
| 5,473,193 | 12/1995 | Temple et al. ........................... | 257/690 |
| 5,508,229 | 4/1996 | Baker ....................................... | 437/183 |
| 5,665,996 | 9/1997 | Williams et al. ......................... | 257/401 |

FOREIGN PATENT DOCUMENTS

| | | |
|---|---|---|
| 1 397 424 | 3/1964 | France . |
| 58-51511 | 3/1983 | Japan . |
| 60-225467 | 11/1985 | Japan . |
| 62-132345 | 6/1987 | Japan . |
| 6-120292 | 4/1994 | Japan . |
| 60-225467 | 9/1995 | Japan . |

*Primary Examiner*—Tom Thoms
*Assistant Examiner*—Ori Nadav
*Attorney, Agent, or Firm*—Skjerven, Morrill, MacPherson, Franklin & Friel; David E. Steuber

[57] ABSTRACT

The on-resistance of a vertical power transistor is substantially reduced by forming a thick metal layer on top of the relatively thin metal layer that is conventionally used to make contact with the individual transistor cells in the device. The thick metal layer is preferably plated electrolessly on the thin metal layer through an opening that is formed in the passivation layer.

14 Claims, 12 Drawing Sheets

VERTICAL POWER MOSFET HAVING THICK METAL LAYER TO REDUCE DISTRIBUTED RESISTANCE

CROSS-REFERENCE TO RELATED APPLICATION

This application is a continuation of application Ser. No. 08/367,486, filed Dec. 30, 1994 now U.S. Pat. No. 5,665, 996.

This application is related to Application Ser. No. [Attorney Docket No. M-3029], filed on even date herewith, which is incorporated herein by reference in its entirety.

FIELD OF THE INVENTION

This invention relates to vertical power transistors fabricated in integrated circuit form.

BACKGROUND OF THE INVENTION

Extremely low on-resistances have been achieved in vertical power MOSFET technology by scaling down the breakdown voltage of the power device and by introducing trench gate structures. The advent of these ultra-low on-resistance power MOSFETs has re-emphasized the importance of minimizing parasitic resistance in the semiconductor package and in the metal interconnects on the surface of the die. This question is discussed in an article entitled "Benefits of DMOS Voltage Scaling on Synchronous Buck Regulator Efficiency", International Symposium on Power Semiconductor Devices (1993), p. 141, FIG. 5, incorporated herein by reference in its entirety.

A vertical power transistor, exemplified in FIG. 1A, is a device in which the current flows vertically from a surface of the die to a region in the interior of or on the opposite surface of the die. For example, in the trench MOSFET illustrated in FIG. 1A, electrons flow from a source region 10 through a body region 11 and a lightly-doped or "drift region" 12, to a drain region 13. The flow of current is controlled by a gate 14, which is formed in a trench 15. When gate 14 is turned on, a channel region forms within body region 11 at the surface of the trench 15. A drain contact may be formed on the bottom surface of the structure, or in so-called "quasi-vertical" devices, the drain may be contacted from the top surface of the die through, for example, a "sinker" extending downward from the top surface of the structure.

Contact with the source regions, which are typically shorted to the body region, is made by a thin metal layer 16 which is frequently deposited by evaporation or sputtering. FIG. 1B shows a top view of thin metal layer 16 on a die 17. As is apparent, thin metal layer 16 covers essentially the entire top surface of the die, with the exception of locations reserved for the gate pad, buses used to contact the gate, and a narrow strip around the perimeter of the die. FIG. 1C shows a detailed view of an area 16A of the thin metal layer 16, which reveals that gate 14 is actually formed in a grid pattern which surrounds individual cells 18, which include the exposed surfaces of source region 10 and body region 11. Within each cell 18, the exposed surface of source 10 surrounds the exposed surface of body 11.

If it is assumed that the metal layer is sufficiently conductive that no voltage drop occurs across the surface of the die, then the source contact of every cell can be assumed to be shorted to the other source contacts, i.e., that the cells are connected in parallel as shown in the schematic drawing of FIG. 2, wherein the bond wire resistance is represented as $R_{wire}$. In such a case, the bond wire resistance does indeed look like an ideal series element even if more than one bond wire is used. For MOSFETs having a resistance over several hundred milliohms, this assumption is generally valid.

This assumption is not valid at lower resistances, however, particularly where the resistance of the MOSFETs are reduced by voltage scaling or by high density trench gate technologies. For MOSFET 30 shown in FIG. 3A, for example, if the metal layer 31 contributes a non-negligible resistance, the equivalent circuit of the MOSFET must include resistors interposed between each source contact, as shown in FIG. 3B. In FIG. 3B, $R_{wire}$ represents the resistance of the bond wire, and $R_{metal}$ represents the resistance of the metal layer 31 between each source contact. The transistors (e.g., MOSFET 32) that are located furthest from the bond wire location will have a higher series resistance than those (e.g., MOSFET 33) that are located close to the bond wire. Accordingly, the MOSFET cells cannot be considered in parallel, and the device will have a higher overall on-resistance than otherwise expected.

Increasing the thickness of metal layer 31 prior to the formation of the passivation layer is not a solution to the problem. First of all, the thickness that can be practically fabricated is limited to about 4 μm, and this is an order of magnitude thinner than what would be required to ignore the metal resistance in a 60 V trench or 30 V planar double-diffused (DMOS) device. Moreover, fabricating a thick metal layer risks cracking the passivation layer where the passivation layer overlaps the metal at the die edge (referred to as the "junction termination") or along gate buses within the device. The deposition and etching of a thick metal layer is also a problem and may be incompatible with the fabrication equipment. For example, long metal deposition cycles suffer from the effects of target heating and target depletion which require the use of multiple source targets. Dry etching a thick metal layer requires a very thick layer of photoresist (e.g., 6 μm). as compared to a standard thickness of about 1 μm. Wet etching of a thick metal layer requires Large metal-to-metal spacings (e.g., 15 μm) and may produce notches ("mouse bites") on the gate bus lines.

As shown in the top view of FIG. 4, multiple source bond wires have been used in an effort to "short out" the resistance of the metal layer 31. However, as shown in the equivalent circuit of FIG. 5, this is only a partial solution. Since each bond wire may have a resistance of 30–50 mΩ, the extra bond wires do not fully compensate for the resistance of the metal layer. Moreover, the pinout of the MOSFET package may not accommodate the number of bonding wires desired or the ideal placement of the wires. The resulting non-uniformity in current distribution is shown in FIG. 5 of an article by Frank Goodenough entitled "P-DMOSFET and TSSOP Turns On With 2.7 $V_{gs}$". Electronic Design, May 2, 1994, pp. 89–95, incorporated herein by reference in its entirety, which qualitatively describes the higher equivalent resistance of the die.

The resistance attributable to the metal layer may account for a significant percentage of the total resistance of a power MOSFET. For example, in a 12 mΩ MOSFET, the metal layer resistance may account for a full 5 mΩ of the total.

The problem is so severe that in some cases extreme solutions have been attempted. One such approach is "stitch bonding", shown in FIGS. 6A and 6B, wherein the bonding wire is repeatedly bonded to the surface of the die in a snake-like pattern. This approach suffers from numerous problems. It takes specialized bonding equipment. The bond wire must follow a straight line while avoiding the gate buses. This may not be possible in a particular die. Moreover, the number and angles of the stitch bonds may not be compatible with a given package and pinout, and the repeated bonding at close spacing subjects the die to a higher mechanical stress than normal wire bonding. The multiple bonds also take longer than normal bonding, so that production throughput is reduced.

Accordingly, what is needed is a simple, cost-effective technique for reducing the distributed resistance of the source metal layer in a vertical power transistor. The ideal solution would not influence the spacing between the source metal and the gate metal, would readily permit wire-bonding with gold or aluminum wire, and would not adversely affect the integrity of the passivation layer at the edge of the die or along any metal step. Finally, the solution should not require more than one source bond wire (except to reduce the wire resistance itself) and should not place any restrictions on the placement or angle of the source bond wire.

SUMMARY OF THE INVENTION

A vertical power transistor according to this invention includes a semiconductor die in which a plurality of transistor cells are arrayed on a surface of the die, contact with the cells being made by a relatively thin metal layer that is deposited over the surface of the die. An opening is created in passivation layer, over the thin metal layer, and in the opening is formed a relatively thick metal layer which is not covered by the passivation layer. The thick metal layer may consist of several sublayers. In a preferred embodiment, for example, a relatively thin adhesion sublayer may be formed directly over the thin metal layer, followed by a thick plated sublayer and a relatively thin bonding sublayer. A wire is bonded to the thick metal layer at a desired location. The thick metal layer provides essentially no resistance between the transistor cells, and therefore the overall resistance of the power transistor is dramatically reduced.

In accordance with the method of this invention, an opening is formed in the passivation layer, preferably at the same time that the opening for the gate bonding pad is formed. The opening is formed over the relatively thin metal layer which connects to the individual cells of the power transistor. A relatively thick metal layer is deposited in the opening, preferably by depositing a thin adhesion sublayer and then plating a thick metal sublayer on top of the adhesion sublayer. A thin bonding sublayer is preferably deposited on top of the thick metal sublayer. In the preferred embodiment, the adhesion sublayer is zinc, the thick plated sublayer is nickel, and the bonding sublayer is gold.

DESCRIPTION OF THE INVENTION

Figure 7A:
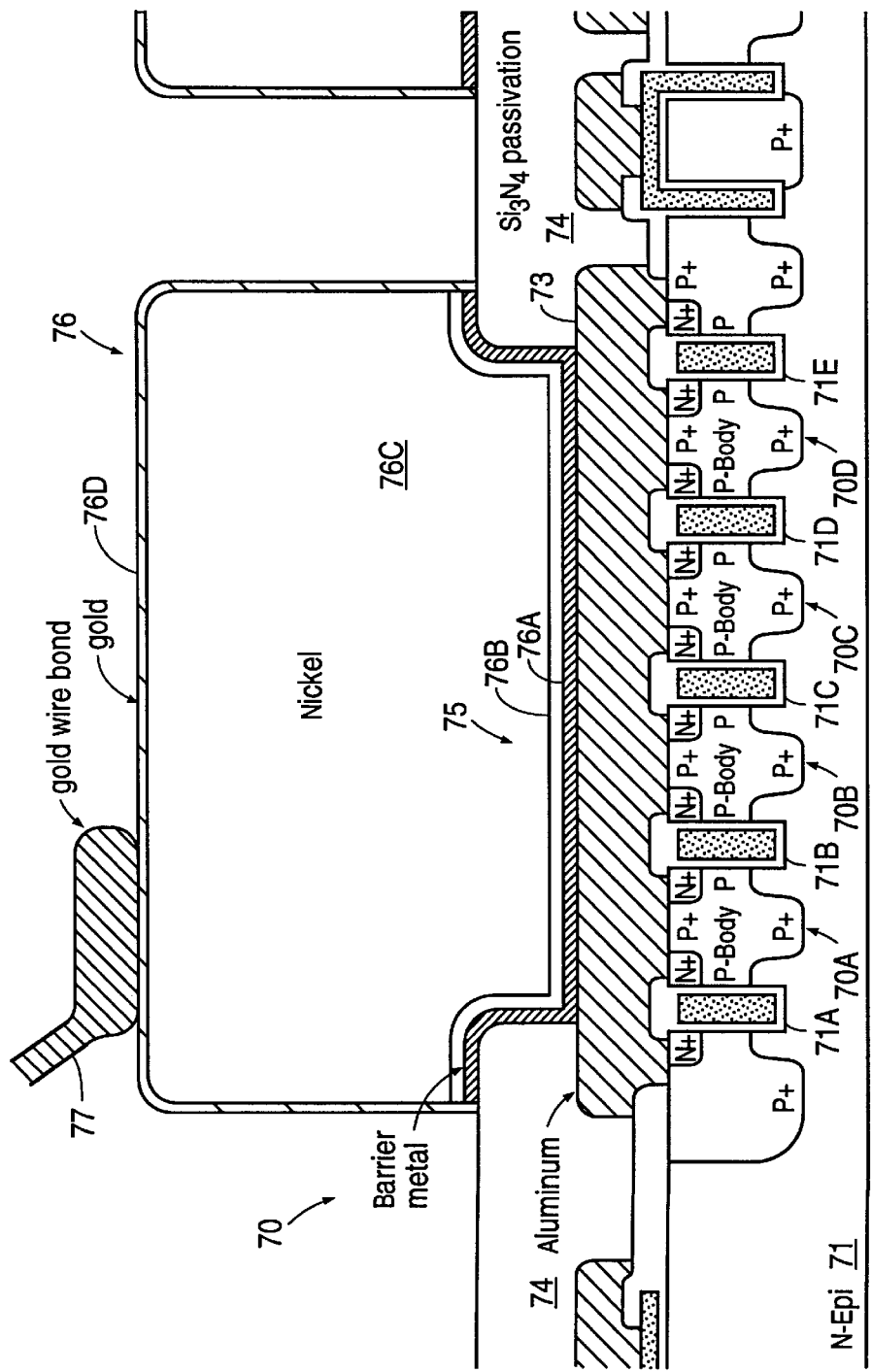
FIG. 7A illustrates a cross-sectional view of a vertical power MOSFET in accordance with the invention, in which an edge of the thick metal layer overlaps the passivation layer.
Figure 7B:
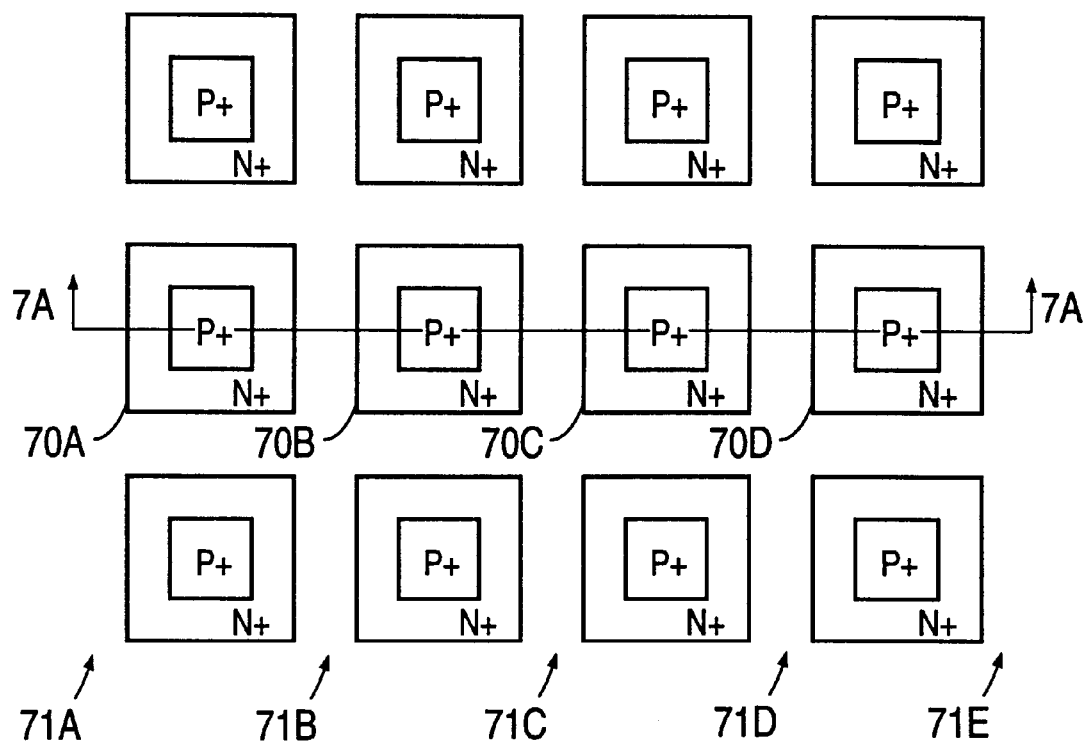
FIG. 7B illustrates a top view of several of the MOSFET cells shown in FIG. 7A.

A cross-sectional view of a vertical power MOSFET in accordance with this invention is illustrated in FIG. 7A. Power MOSFET 70 is formed in an N-type epitaxial layer 71, which is grown on the top surface of an N+ substrate 72. Power MOSFET 70 includes individual transistor cells 70A–70D, which are formed between trenches 71A–71E, respectively. As shown in the top view of FIG. 7B, in this embodiment trenches 71A–71E are formed in a rectilinear pattern, although in other embodiments they may be formed in some other polygonal pattern or as a series of parallel trenches. As is evident from FIG. 7B, the trenches within gates 71A–71E are in reality interconnected in a grid. FIG. 7A is taken at the cross-section 7A—7A indicated in part in FIG. 7B.

MOSFET 70 is an N-channel device. Thus, when the voltage at the gate is increased, an electron current flows from N+source regions located at the surface of N-epitaxial layer 71 downward through a channel adjacent the trench and into the drain, which is represented by epitaxial layer 71 and substrate 72.

Contact with the N+ source regions is made by means of a thin metal layer 73, typically aluminum, which is formed at the top surface of epitaxial layer 71. Thin metal layer 73 is typically in the range of 0.8 to 2.8 μm thick. As is common in power devices, the P-body region within each cell is shorted to the N+ source region by means of thin metal layer 73. A passivation layer 74, which in this embodiment consists of $Si_3N_4$, is formed over the top surface of MOSFET 70.

In accordance with this invention, an opening 75 is formed in passivation layer 74 over thin metal layer 73. A thick metal layer 76 is formed in opening 75. In this embodiment, thick metal layer 76 includes four sublayer. Thin metal adhesion sublayers 76A makes contact with metal layer 73. Assuming that thin metal layer 73 consists of aluminum, adhesion sublayer 76A may be formed of zinc and sublayer 76B may be formed of aluminum or may be omitted. Adhesion sublayer 76A is as thin as possible but less than 1000 A thick. Alternatively, sublayer 76A may be titanium and sublayer 76B may be nickel.

On top of adhesion sublayers 76A and 76B, a thick metal sublayer 76C is deposited, preferably on the order of 10–30 μm thick. In this embodiment, thick metal sublayer 76C is formed of nickel. Finally, a thin surface sublayer 76D is deposited on the surface of sublayer 76C. In this embodiment, surface sublayer 76D is formed of gold to allow for easy wire-bonding to thick metal layer 76. Alternatively, thick sublayer 76C could be gold in which case surface sublayer 76D may be omitted. In FIG. 7A, an aluminum wire 77 is bonded to the top surface of metal layer 76.

As is evident from FIG. 7A, thick metal layer 76 overlaps the edges of passivation layer 74. As explained in more detail below, this protects thin metal layer 73 during the etching of sublayers 76A and 76B.

Thick metal layer 76 essentially shorts out metal layer 73, with the result that transistor cells 70A–70D are connected in parallel. The total on-resistance of power MOSFET 70 is therefore substantially reduced as compared with an embodiment in which thick metal layer 76 is omitted.

Figure 8:
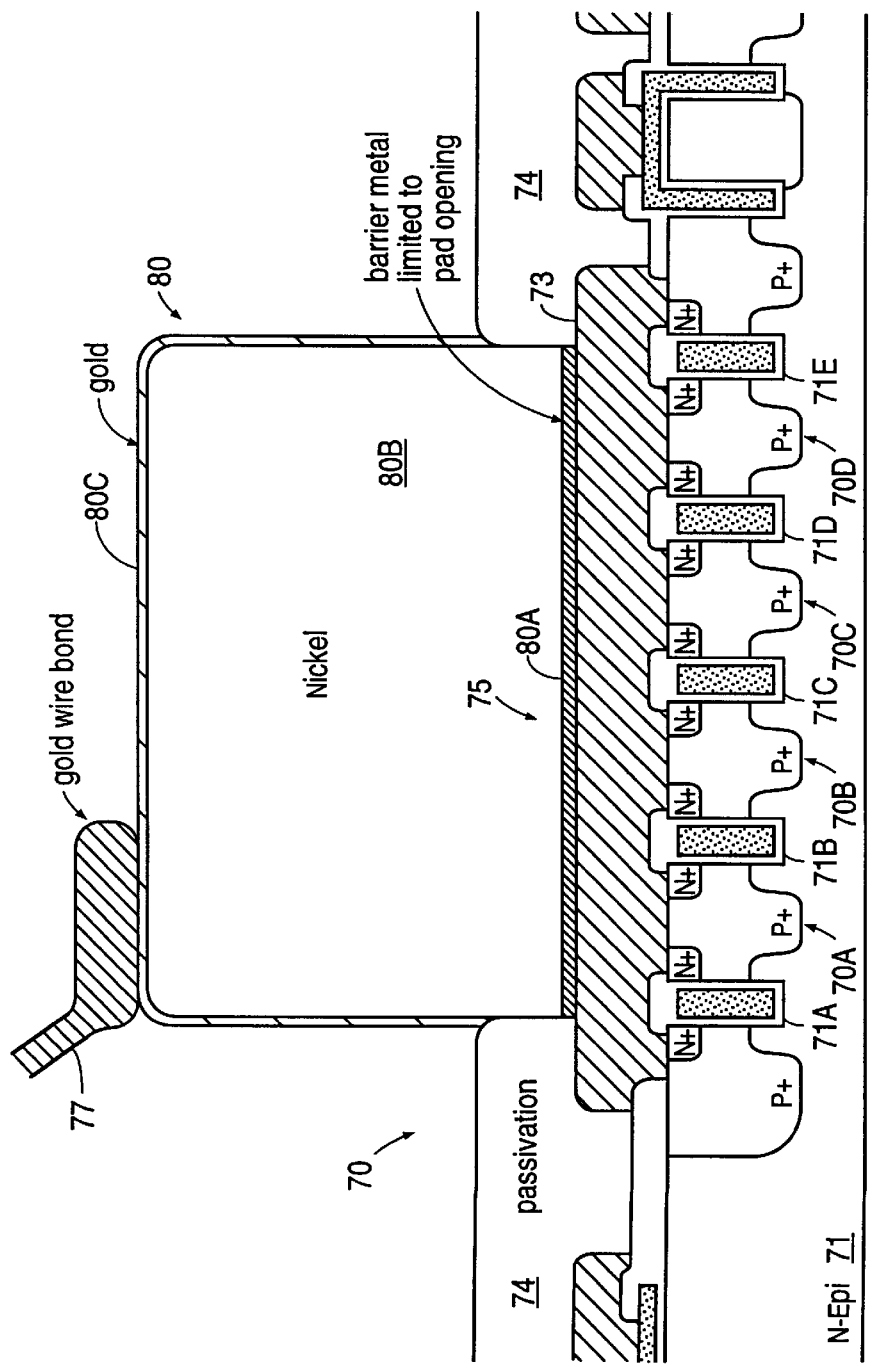
FIG. 8 illustrates a cross-sectional view of an alternative embodiment of a vertical power MOSFET in accordance with the invention, in which the thick metal layer does not overlap the passivation layer.

FIG. 8 shows a similar embodiment except that thick metal layer 80 does not overlap the edges of passivation layer 74 and instead is limited to the area of opening 75. Thick metal layer 80 consists of a zinc adhesion sublayer 80A, a thick nickel sublayer 80B, and a gold surface sublayer 80C.

The following is a description of a process for forming thick metal layer 76. The process begins after passivation layer 74 has been formed.

Figure 1A:
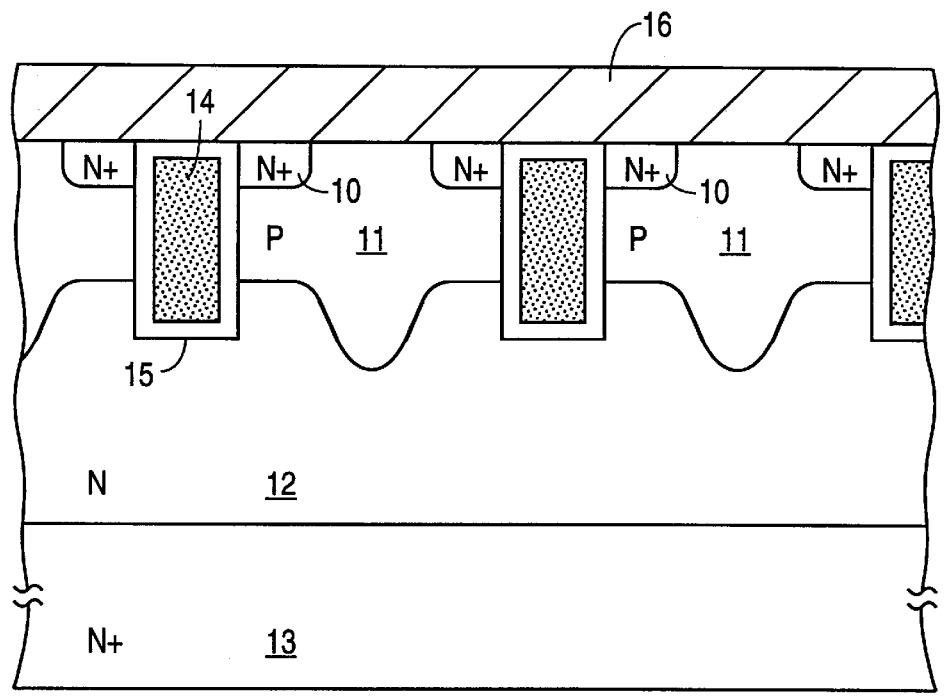
FIG. 1A illustrates a cross-sectional view of a vertical power transistor, showing a conventional thin metal layer used to make contact with the individual cells of the device.
Figure 1B:
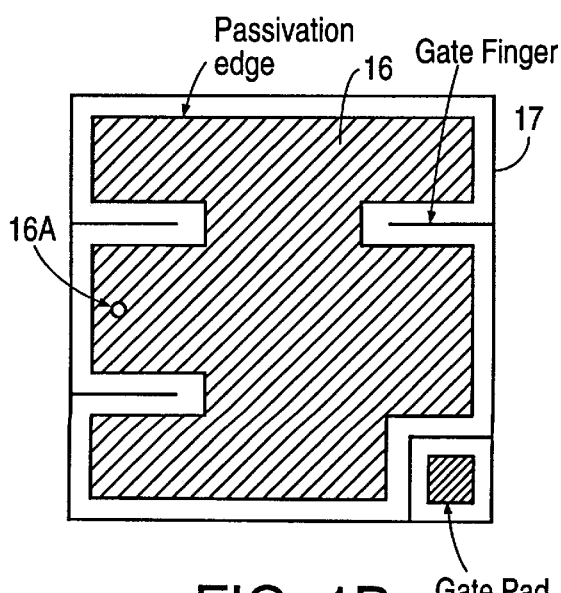
FIG. 1B is a top view of the power transistor of FIG. 1A.
Figure 1C:
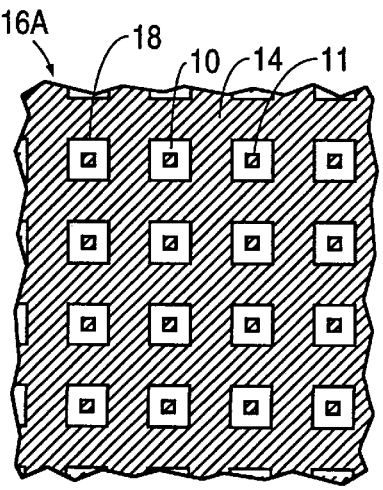
FIG. 1C is a detailed top view of a portion of the metal layer shown in FIG. 1B.
Figure 2:
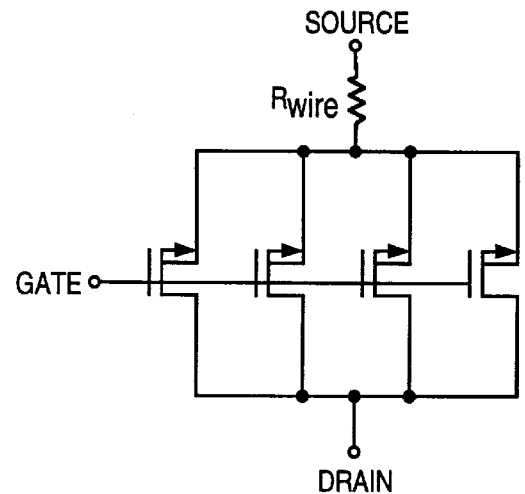
FIG. 2 illustrates an equivalent circuit of an ideal vertical power transistor.
Figure 3A:
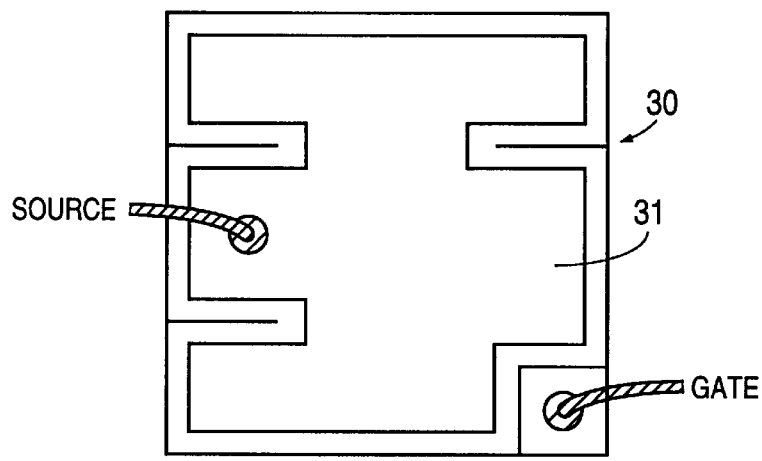
FIGS. 3A and 3B are a top view and an equivalent circuit, respectively, of a power MOSFET, FIG. 3B showing the resistance of the top metal layer.
Figure 3B:
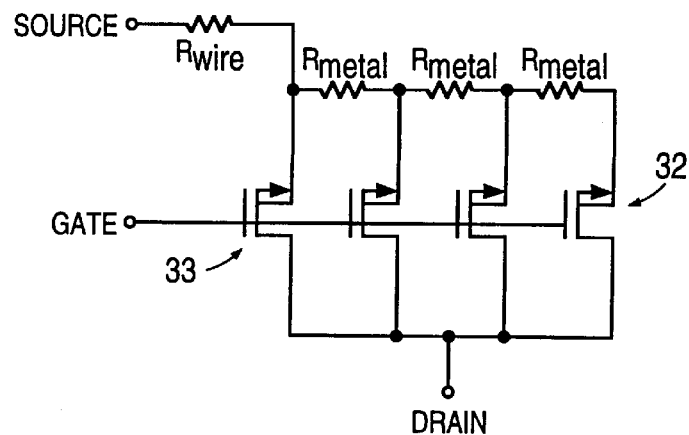
Figure 4:
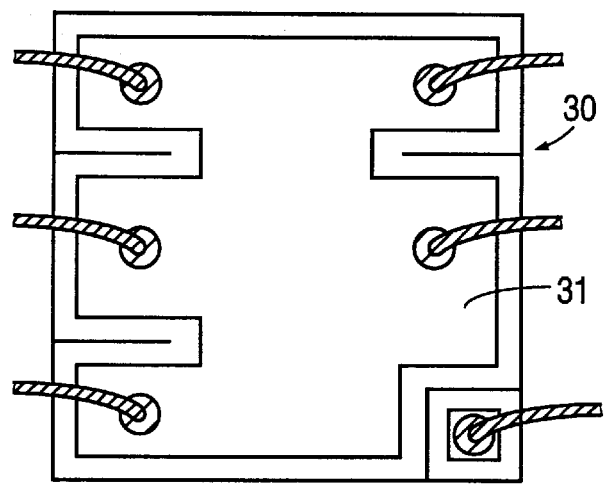
FIG. 4 illustrates a power transistor having multiple bond wires.
Figure 5:
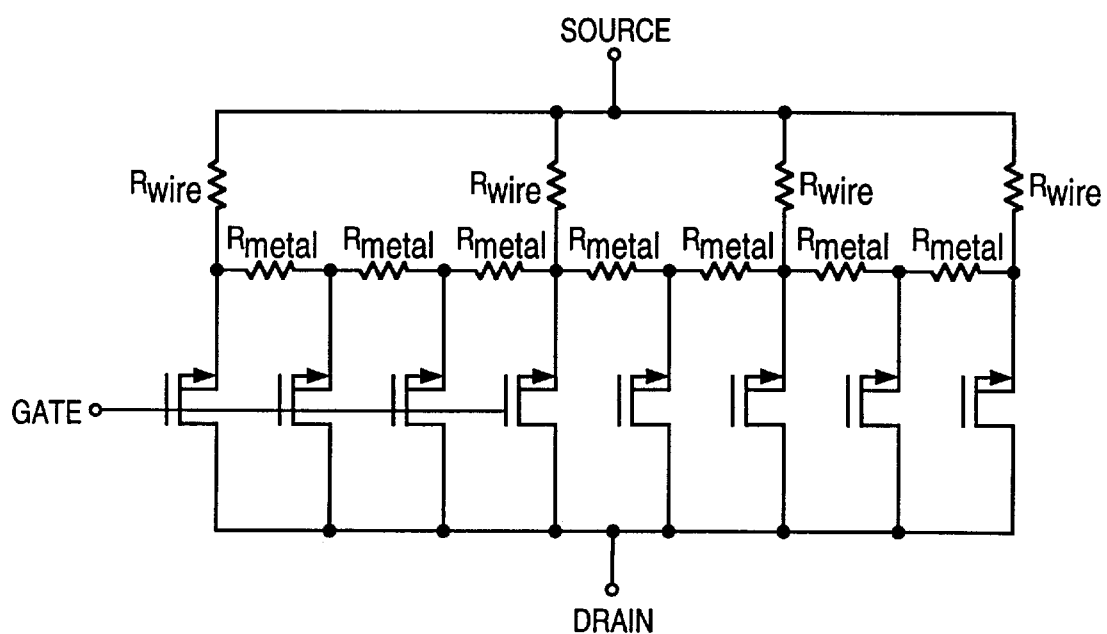
FIG. 5 illustrates an equivalent circuit of the transistor shown in FIG. 4.
Figure 6A:
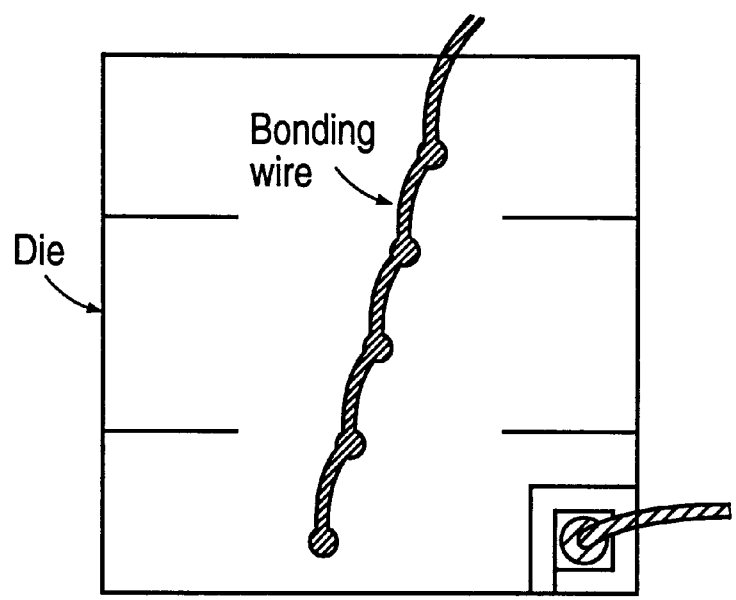
FIGS. 6A and 6B show top and side views, respectively, of a power transistor in which the connecting wire is "stitch" bonded to the top metal layer.
Figure 6B:
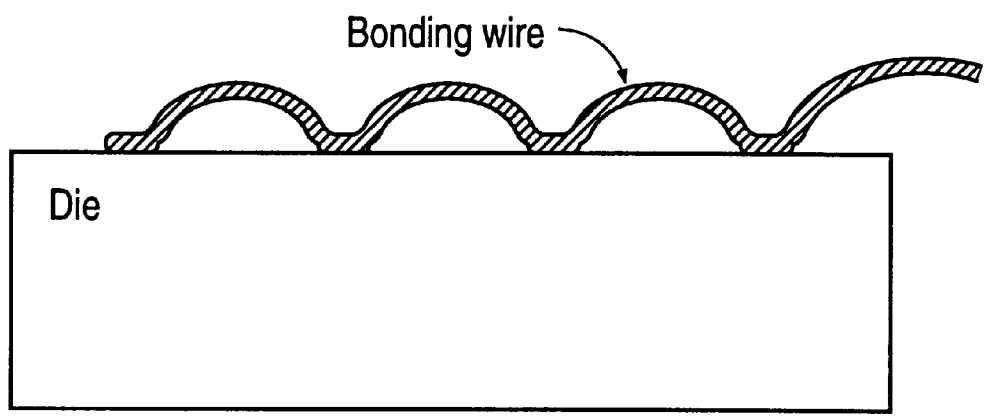

1. The same mask that is used to form the pad openings in passivation layer 74 (see, for example, FIG. 1B) is used to define the location of opening 75 over thin metal layer 73, which in this embodiment is aluminum.

2. Passivation layer 74 is etched with a wet chemical or dry etchant to form opening 75 . For example, a reactive ion etch (RIE) may be used.

3. The exposed surface of thin metal layer 73 is degreased with tricholoroethane (TCA), and immediately before the following step, hydrofluoric acid (HF) is used to etch any oxide that has formed on the exposed surface.

4. For the embodiment shown in FIG. 7A, a zinc layer is deposited by evaporation or sputtering on the top surface of metal layer 73 and passivation layer 74. The zinc layer :ls preferably several monolayers thick, and it is followed by the deposition by evaporation or sputtering of a thin nickel layer. The zinc and nickel layers are then masked and etched, using, for example, a reactive ion etch (RIE), to form sublayers 76A and 76B. As shown in FIG. 7A, sublayers 76A and 76B extend over the edges of passivation layer 74 (preferably by about 5 $\mu$m). This overlap is recommended to insure that the thin metal layer 73 is not damaged during the etching of the zinc and nickel layers or during subsequent etches or wet chemistry.

5. Thick nickel sublayer 76C is then electrolessly plated on the top surface of thin nickel layer 76B. In a preferred embodiment, nickel sublayer 76C is preferably 10–30 $\mu$m thick, but other thicknesses are possible. In the electroless plating process, the nickel does not adhere to the top surface of passivation layer 74. In the embodiment illustrated in FIG. 8, a zincate solution is used to electrolessly plate a thin layer of zinc, and the surface of the zinc layer is etched with sulfuric acid, preferably several times, to form a smooth, uniform zinc layer. The result is zinc sublayer 80A, which is preferably a monolayer. This eliminates the need to mask and etch the adhesion layer. Thick nickel sublayer BOB is then electrolessly plated on the top surface of zinc sublayer 80A.

6. The thick nickel sublayer (sublayer 76C in FIG. 7A, sublayer BOB in FIG. 8) is plated electrolessly, using a hypophosphate nickel solution, to a target thickness (e.g., 12–25 $\mu$m).

7. The exposed surface of the nickel sublayer is rinsed with water.

8. The wafer is immersed in a gold solution to plate a thin gold layer 0.1 to 0.3 $\mu$m thick on the nickel sublayer.

9. The gold layer is cleaned with hydrochloric acid.

10. Gold is plated on the thin gold layer electrolessly using an autocatalytic cyanide/gold solution. The result is gold layer 76D in FIG. 7A, 80C in FIG. 8.

11. A final water rinse is performed. After die attach, wires are bonded to the exposed gold, preferably near the edge of the die. Gold or aluminum wires may be used.

12. The top side of the wafer is then protected with plastic tape, and the wafer is thinned mechanically. The tape is then removed. This is followed by the electrical testing of the dice, after which they are sorted and scribed in the conventional manner. The dice which test successfully are selected and attached with epoxy to the package, and the pins for the source and gate connections are wire-bonded to the source (layers 76 and 80) and gate (not shown) of the MOSFET. The package is then filled with plastic molding or sealed, and the leadframe is formed. Alternatively, the die need not be packaged but may, for example, be used in a hybrid integrated circuit. Moreover, the connections to the die may conveniently be made by tape automated bonding (TAB).

Further information on this process is contained in Lawrence Durani, *Engineering Handbook*, 4th Ed., pg. 438, incorporated herein by reference.

Figure 9A:
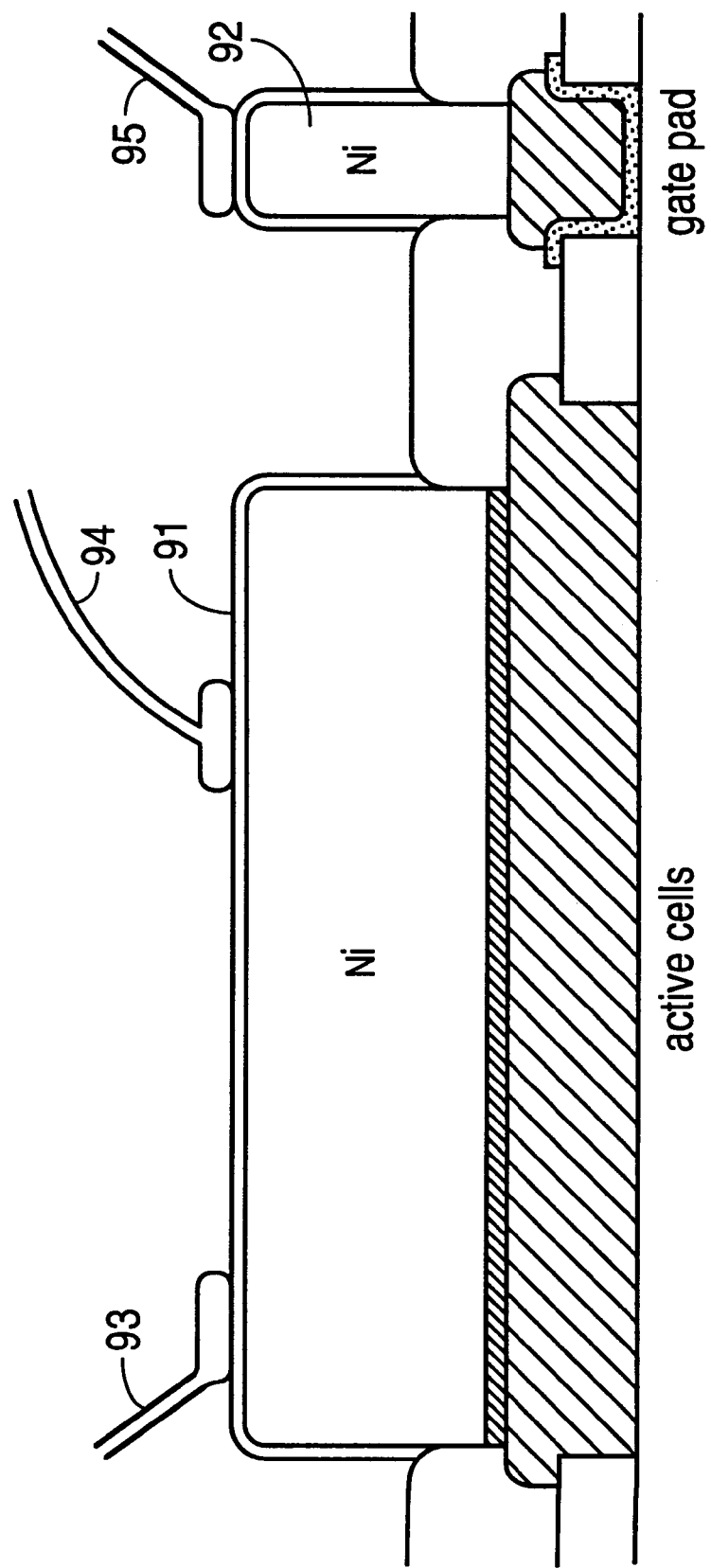
FIGS. 9A and 9B illustrate cross-sectional and top views, respectively, of a vertical power transistor showing a thick metal layer over the transistor cells and the gate contact pad.
Figure 9B:
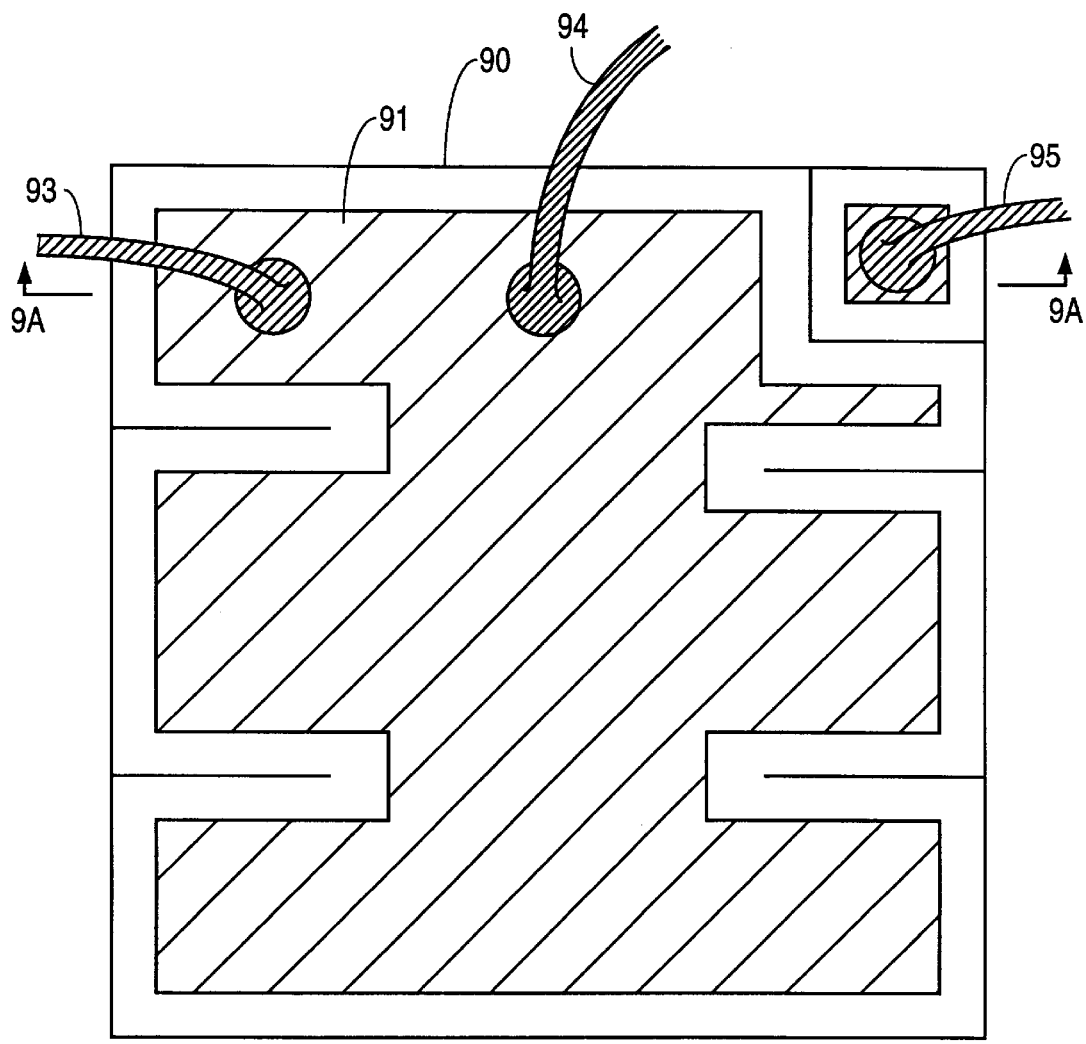

FIGS. 9A and 9B show cross-sectional and top views, respectively, of a die 90 which includes a thick metal layer 91. for connecting to the active cells and a second thick metal layer 92 for connecting to the gate pad. FIG. 9A is taken at cross-section 9A—9A shown in FIG. 9B. Also shown are wires 93 and 94 which are bonded to thick metal layer 91, and a wire 95 which is bonded to thick metal layer 92.

Figure 10A:
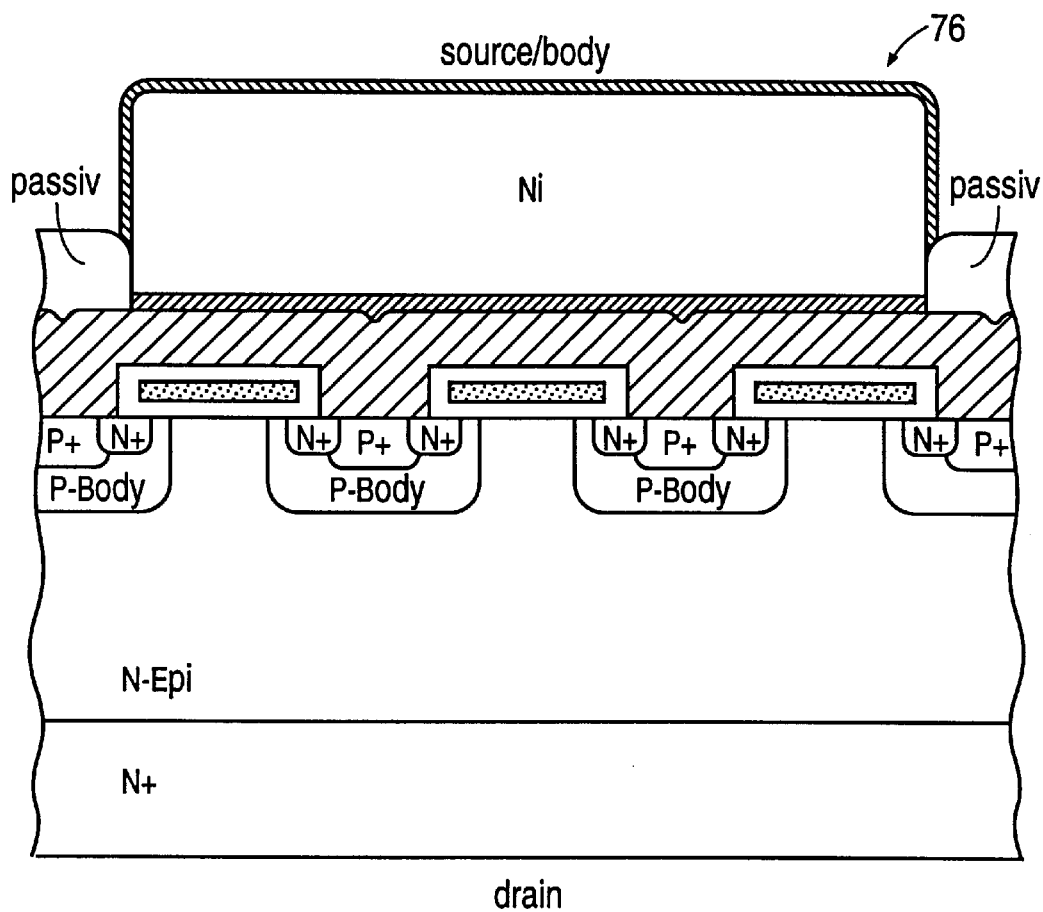
FIGS. 10A–10C illustrate alternative forms of transistor cells that may included in a power transistor in accordance with this invention.
Figure 10B:
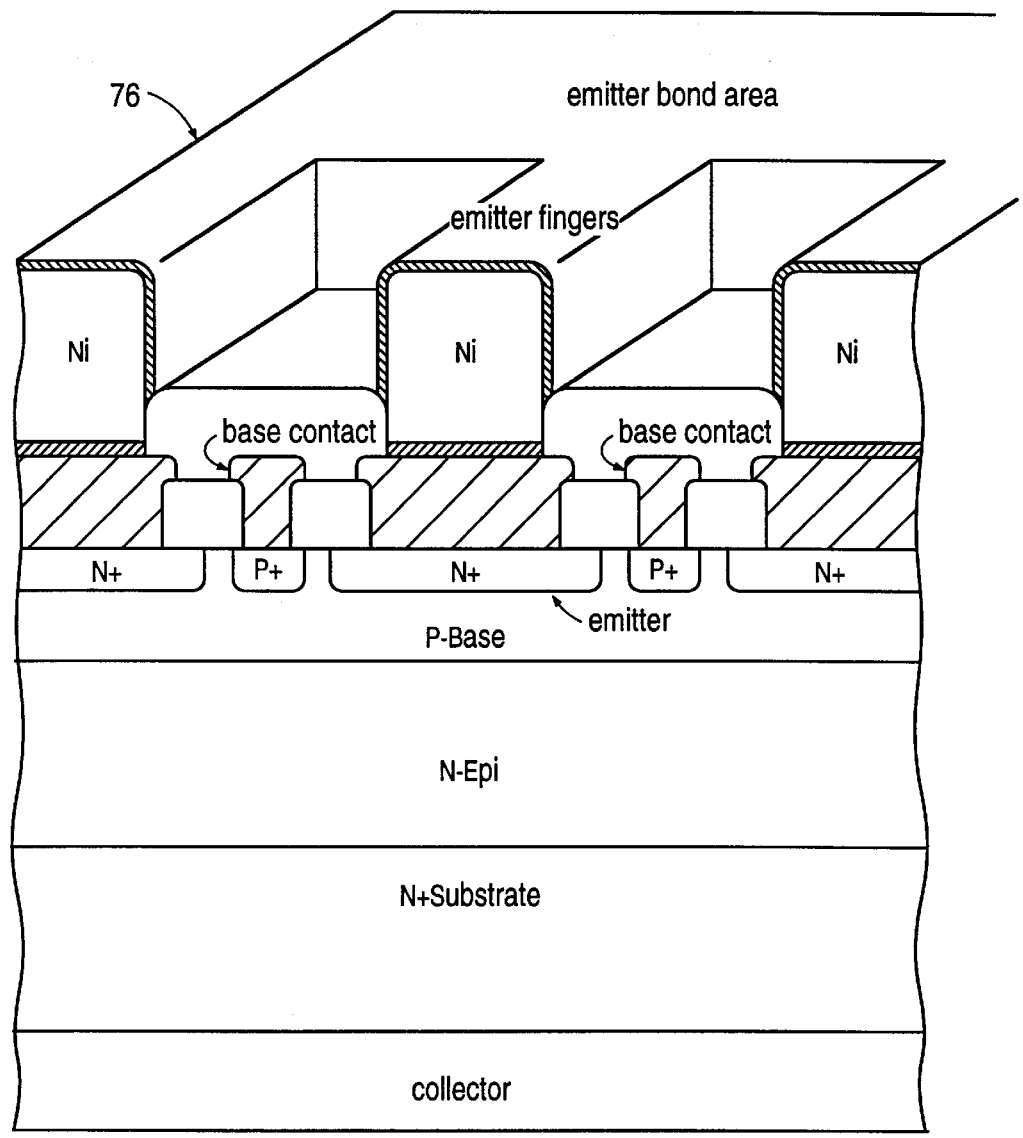
Figure 10C:
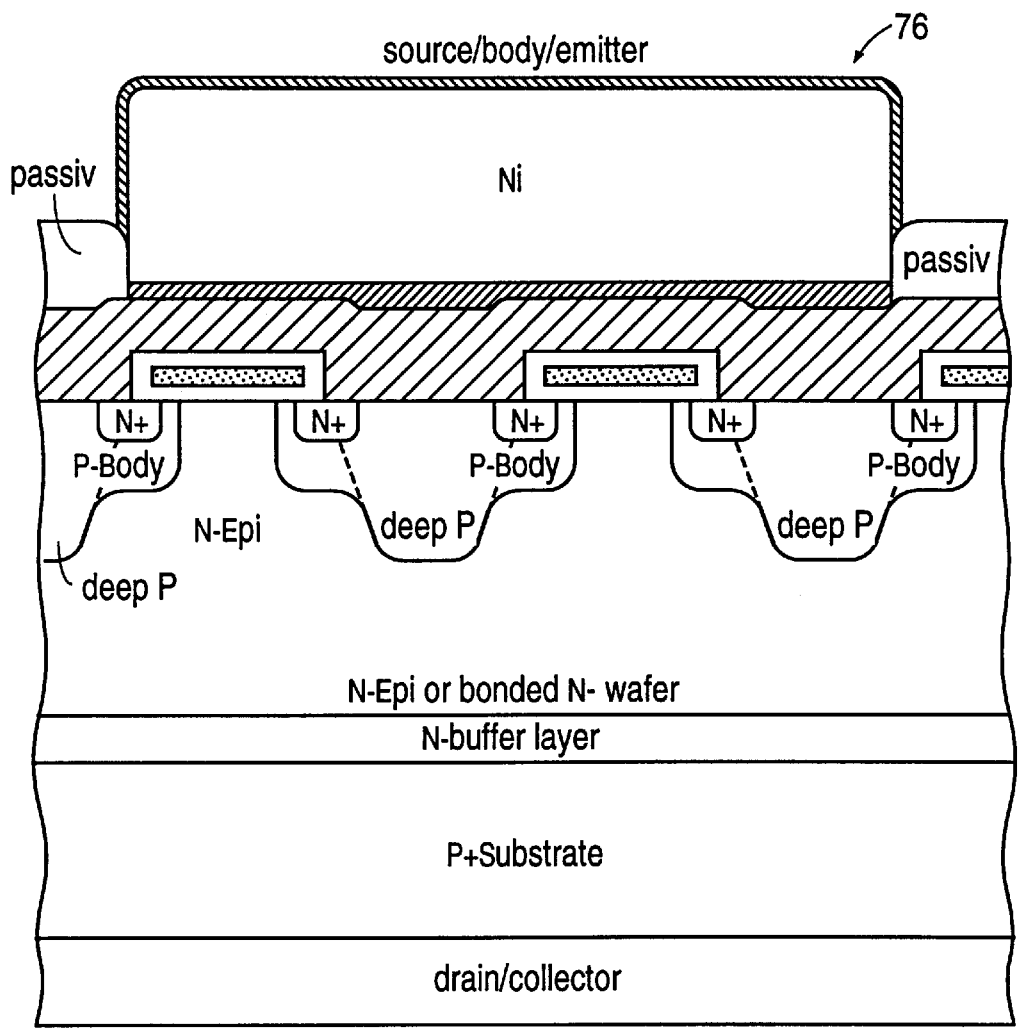

While the embodiments discussed above include power MOSFETs which include a trenched gate, the broad principles of this invention are applicable to any type of vertical power transistor which includes an array of cells which are to be connected to a single terminal. For example, the cells may each include a planar vertical DMOS field effect transistor (FIG. 10A); a vertical power bipolar transistor (FIG. 10B); or a vertical insulated gate bipolar transistor (IGBT) (FIG. 10C). The individual cells may be arrayed in a quadrilateral, hexagonal or any other type of pattern. With reference to FIG. 10B, it will be noted that thick metal layer 76 includes "fingers" which extend over the emitters of the transistor cells, thereby allowing room for metal contacts to the base region in each cell.

The foregoing description is intended to be illustrative and not limiting. The broad principles of this invention are defined only in the following claims.

We claim:

1. A vertical current flow power semiconductor device comprising:

a semiconductor substrate comprising a two-dimensional array of transistor cells, each of said cells comprising a first region of a first conductivity type and a body region of a second conductivity type opposite to said first conductivity type, a periphery of said array defining an area of a top surface of said substrate;

a bilayer structure comprising a thick metal layer and a thin metal layer and at least one adhesion layer between said thick metal layer and said thin metal layer, said thick metal layer comprising a first metal and said thin metal layer comprising a second metal, said bilayer structure overlying the entirety of said area, said thin metal layer being in electrical contact with each of said cells, said thick metal layer having a thickness greater than a thickness of said thin metal layer, a bottom surface of said thick metal layer being in continuous, uninterrupted physical contact with a top surface of said thin metal layer throughout said area; and a bond wire electrically connected to said thick metal layer.

2. The vertical current flow semiconductor device of claim 1 wherein said bilayer structure is adjacent a passivation layer, a top surface of said bilayer structure and a top surface of said passivation layer together forming a top surface of said device, and wherein said thick metal layer overlaps an edge of said passivation layer.

3. The vertical current flow semiconductor device of claim 1 wherein said bilayer structure is adjacent a passivation layer, a top surface of said bilayer structure and a top surface of said passivation layer together forming a top surface of said device, and wherein said passivation layer overlaps an edge of said thin metal layer.

4. The vertical current flow semiconductor device of claim 1 wherein said first metal is nickel and said second metal is aluminum.

5. The vertical current flow semiconductor device of claim 4 wherein said thick metal layer comprises a sandwich of nickel, zinc and gold sublayers.

6. The vertical current flow semiconductor device of claim 1 wherein said bond wire comprises aluminum.

7. The vertical current flow semiconductor device of claim 1 wherein said bond wire comprises gold.

8. The vertical current flow semiconductor device of claim 1 wherein said thin metal sublayer comprises aluminum and comprising a first adhesion layer comprising zinc.

9. The vertical current flow semiconductor device of claim 8 comprising a second adhesion layer comprising aluminum.

10. The vertical current flow semiconductor device of claim 1 wherein said thin metal sublayer comprises aluminum and comprising a first adhesion layer comprising titanium.

11. The vertical current flow semiconductor device of claim 10 comprising a second adhesion layer comprising nickel.

12. A vertical current flow power semiconductor device comprising:

a semiconductor substrate comprising a two-dimensional array of transistor cells, each of said cells comprising a first region of a first conductivity type and a body region of a second conductivity type opposite to said first conductivity type;

a bilayer structure for establishing electrical contact with at least some of said transistor cells, said bilayer structure comprising a thick metal layer comprising a first metal and a thin metal layer comprising a second metal, said thick metal layer overlying said thin metal layer and having a thickness greater than a thickness of said thin metal layer, a bottom surface of said thick metal layer being in contact with a portion of a top surface of said thin metal layer; and a passivation layer, wherein the entirety of said top surface of said thin metal layer is in contact with one of said thick metal layer and said passivation layer.

13. A vertical current flow power semiconductor device having an exposed upper surface and comprising:

a semiconductor substrate comprising a two-dimensional array of transistor cells, each of said cells comprising a first region of a first conductivity type and a body region of a second conductivity type opposite to said first conductivity type;

a bilayer structure for establishing electrical contact with at least some of said transistor cells, said bilayer structure comprising a thick metal layer comprising a first metal and a thin metal layer comprising a second metal, said thick metal layer overlying said thin metal layer and having a thickness greater than a thickness of said thin metal layer, a bottom surface of said thick metal layer being in contact with at least a portion of a top surface of said thin metal layer, said thick metal layer having an exposed upper surface; and a passivation layer having an exposed upper surface, wherein said exposed upper surface of said semiconductor device consists entirely of said exposed upper surface of said thick metal layer and said exposed upper surface of said passivation layer.

14. A vertical current flow power semiconductor device having an exposed upper surface and comprising:

a semiconductor substrate comprising a two-dimensional array of transistor cells, each of said cells comprising a first region of a first conductivity type and a body region of a second conductivity type opposite to said first conductivity type;

a gate for controlling a flow of current through said transistor cells;

a first bilayer structure for establishing electrical contact with at least some of said transistor cells, said bilayer structure comprising a first thick metal layer and a first thin metal layer, said first thick metal layer overlying said first thin metal layer and having a thickness greater than a thickness of said first thin metal layer, a bottom surface of said first thick metal layer being in contact with a portion of a top surface of said first thin metal layer;

a second bilayer structure for establishing electrical contact with said gate, said second bilayer structure comprising a second thick metal layer and a second thin metal layer, said second thick metal layer overlying said second thin metal layer and having a thickness greater than a thickness of said second thin metal layer, a bottom surface of said second thick metal layer being in contact with a portion of a top surface of said second thin metal layer; and a passivation layer, wherein said exposed upper surface of said semiconductor device includes an exposed upper surface of said first bilayer structure, an exposed upper surface of said second bilayer structure, and an exposed upper surface of said passivation layer.

* * * * *

UNITED STATES PATENT AND TRADEMARK OFFICE
CERTIFICATE OF CORRECTION

PATENT NO.   : 6,066,877                                            Page 1 of 1
DATED        : May 23, 2000
INVENTOR(S)  : Richard K. Williams et al.

It is certified that error appears in the above-identified patent and that said Letters Patent is hereby corrected as shown below:

Column 1,
Line 12, please delete "[Attorney Docket No. M-3029]" and insert -- 08/367,388 --.
Line 12, after "herewith," please insert -- Now U.S. Patent No. 5,767,546 issued June 16, 1998 --.

Column 5,
Lines 60 and 65, please delete "BOB" and insert -- 80B --.
Line 62, please delete "8OA" and insert -- 80A --.

Signed and Sealed this

Twenty-second Day of October, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,066,877 Page 1 of 1
DATED : May 23, 2000
INVENTOR(S) : Richard K. Williams et al.

It is certified that error appears in the above-identified patent and that said Letters Patent is hereby corrected as shown below:

Column 1,
Line 12, please delete "[Attorney Docket No. M-3029]" and insert -- 08/367,388 --.
Line 12, after "herewith," please insert -- Now U.S. Patent No. 5,767,546 issued June 16, 1998 --.

Column 5,
Lines 60 and 65, please delete "BOB" and insert -- 80B --.
Line 62, please delete "8OA" and insert -- 80A --.

Signed and Sealed this

Twenty-ninth Day of October, 2002

Attest:

Attesting Officer

JAMES E. ROGAN
Director of the United States Patent and Trademark Office